United States Patent [19]

Tam et al.

[11] 4,406,049
[45] Sep. 27, 1983

[54] VERY HIGH DENSITY CELLS COMPRISING A ROM AND METHOD OF MANUFACTURING SAME

[75] Inventors: Matthias L. Tam, Monterey Park; Frank Z. Custode, Norco, both of Calif.

[73] Assignee: Rockwell International Corporation, Anaheim, Calif.

[21] Appl. No.: 397,647

[22] Filed: Jul. 12, 1982

Related U.S. Application Data

[62] Division of Ser. No. 215,485, Dec. 11, 1980.

[51] Int. Cl.³ .................... H01L 21/22; H01L 21/265
[52] U.S. Cl. ................................ 29/571; 29/576 B; 29/577 C; 29/578; 357/23 VT
[58] Field of Search ................. 29/577 C, 571, 576 B, 29/578; 357/23 VT

[56] References Cited

U.S. PATENT DOCUMENTS

| | | | |
|---|---|---|---|
| 3,699,646 | 10/1972 | Vadasz | 29/571 |
| 4,096,522 | 6/1978 | Suzuki et al. | 357/41 X |
| 4,231,051 | 10/1980 | Custode et al. | 148/188 X |
| 4,235,011 | 11/1980 | Butler et al. | 29/577 C |
| 4,280,271 | 7/1981 | Lou et al. | 148/174 X |

Primary Examiner—G. Ozaki
Attorney, Agent, or Firm—H. Fredrick Hamann; S. Alfred Uchizono

[57] ABSTRACT

The subject invention conserves memory real estate by employing ROM cells which are FETs or non-FETs depending upon the programming. Each cell comprises a gate, a source and drain region and provision for connections to bit and word lines. Programming is achieved by a mask which permits doping of the source and drain regions to comprise FETs for the cells indicative of one state of logic while precluding doping of the source and drain regions to complete the channel in the cells comprising the other state of logic. Also, the FETs are fabricated, their contacts extending linearly between bit lines which are preferably diffused lines, and the word line making direct contact with gates of the linear cells. The process simplifies the number of steps required to manufacture the FETs and non-FETs by simply providing the programming after the basic cells are formed. Such unprogrammed structures may be inventoried and simply programmed i.e. completed by selective doping and establishing of contacts to fulfill orders to customer specifications immediately.

1 Claim, 12 Drawing Figures

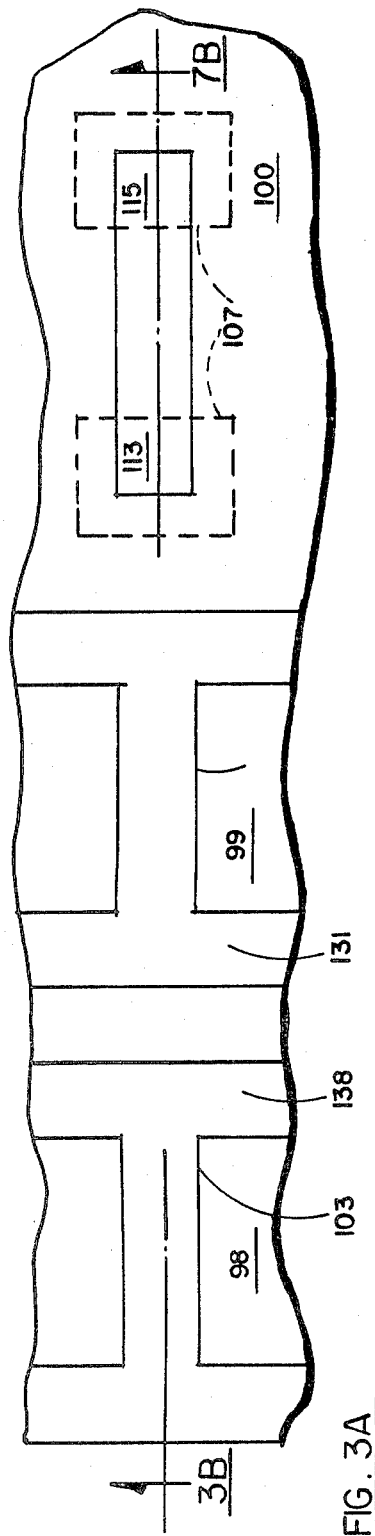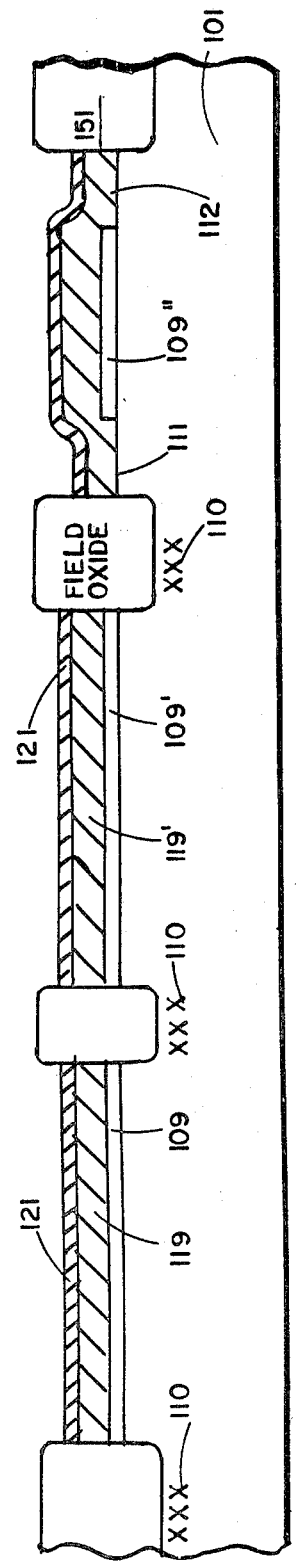
FIG. 3A
FIG. 3B

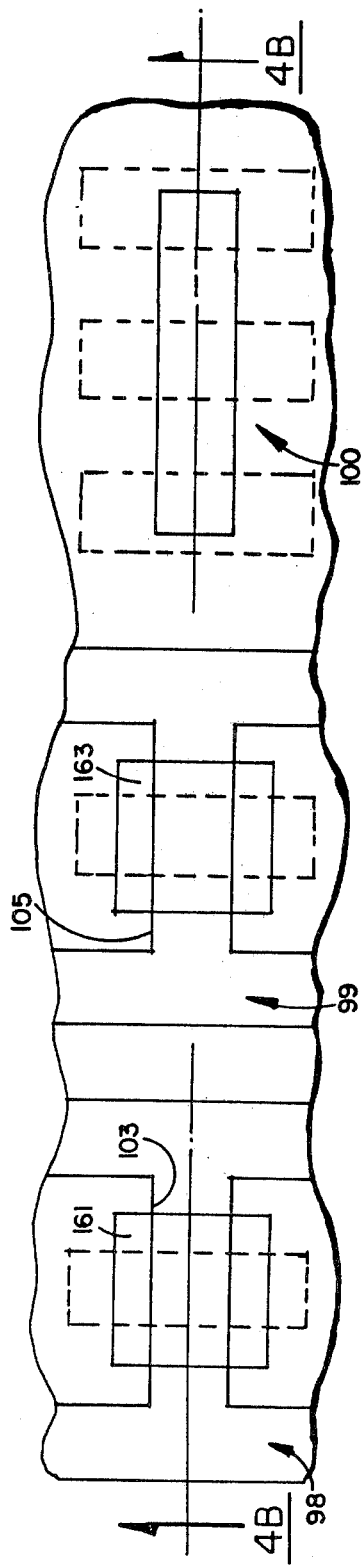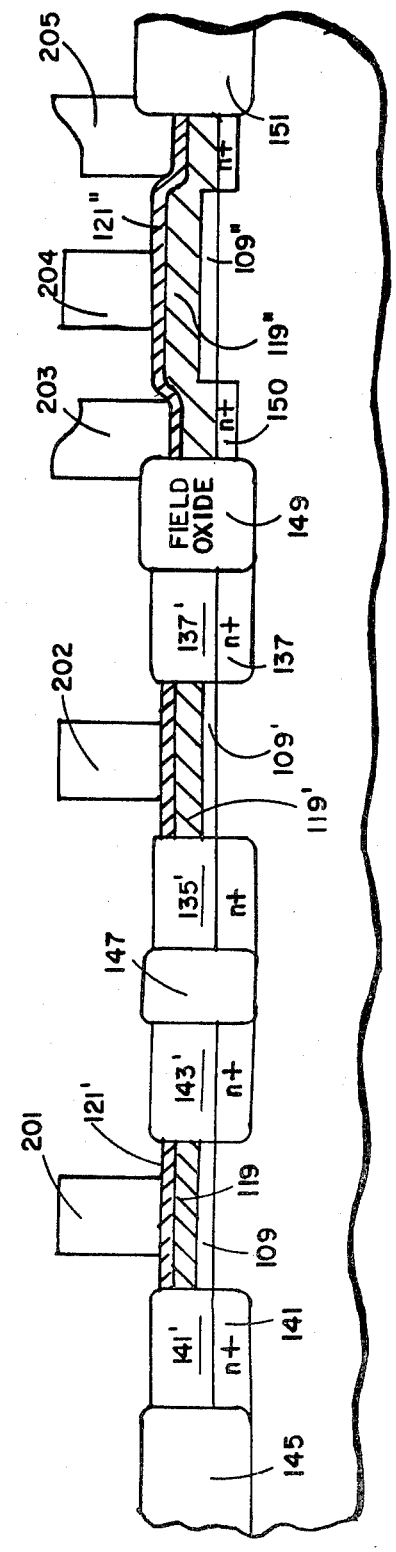

VERY HIGH DENSITY CELLS COMPRISING A ROM AND METHOD OF MANUFACTURING SAME

This application is a division of application Ser. No. 215,485, filed Dec. 11, 1980.

FIELD OF THE INVENTION

The present invention relates to the field of novel high-density ROMs and methods of manufacturing same, and more particularly to ROMs employing FETs and non-FETs as the cells determining the programming thereof.

BACKGROUND OF THE INVENTION

No prior art is known wherein FET construction may proceed to the point where doping is provided for selected FETs to complete their manufacture and provide a 1 state of logic whereas the other cells are undoped to preclude the fabrication of complete FETs which signify the other state of logic.

The closest prior art known is U.S. Pat. No. 4,231,051 issued to the same inventors on Oct. 28, 1980, which discloses a basic process subject to modification to produce the products of the present invention. Such process, however, does not produce a high density ROM comprised of FETs and non-FETs for programming. Nor does the subject process require any second layer of polysilicon to produce the FETs and non-FETs. Nor does the referenced process employ a programming mask. Nor does the prior art show any inventoriable ROMs which are processed to the point of determining which cells will comprise FETs and which will not and then the ROM is completed according to the customer's specifications immediately.

SUMMARY OF THE INVENTION

The subject invention comprises a high density ROM having a plurality of cells selected ones of which comprise FETs indicative of one state of logic and the other cells being uncompleted FETs indicative of the other state of logic. The process of manufacturing and coding are both unique in that an inventoriable product is available up to the point of programming and a programming mask is utilized to determine the selected cells to receive source and drain doping to convert them to FETs for determining said logic states.

BRIEF DESCRIPTION OF THE DRAWINGS

FIGS. 3A and 3B illustrate the fabrication of a ROM by showing an uncompleted FET to the left, the completed FET in the center and a gating transistor to the right, while depicting some ten processing steps.

FIGS. 4A and 4B illustrate steps 11 through 15 in fabricating the ROM and substrate structures.

DESCRIPTION OF THE PREFERRED EMBODIMENT

The preferred embodiment of the invention is illustrated in the figures, but not all the steps are absolutely necessary to the completed device, and as a matter of fact the gating transistor and interconnect structure may be totally avoided and included externally of the ROM. Simarily, the sequence of steps, while preferred, is not in necessary order, and many steps may be reordered while effecting structures capable of the same principles of operation as herein described for the subject invention.

In general, there are two approaches in the design and layout of ROM cells, the first being the use of metal word lines with diffusion bit lines, and the second being the use of poly word lines with metal bit lines. The first mentioned approach results in a NOR-gate configuration, while the second approach results in the NAND-gate configuration which generally has slower speed because bit lines have to be discharged through several transistors connected in series, the number of series transistors depending on the ROM circuit density.

In ROMs where high speed is required, a cell layout must use a metal word line and diffusion bit lines. The present state-of-the-art n-channel silicon gate technology results in a ROM cell design as shown in FIG. 1, while the subject invention discloses the new structure as illustrated in FIG. 2.

Figure 1:
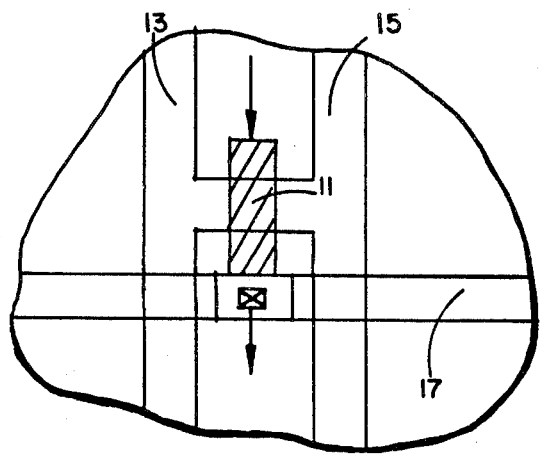
FIG. 1 shows a prior art type FET cell in the ROM where the FET is aligned with diffusion bit lines and the gate contact to the metal word line protrudes unnecessarily as may be seen by a comparison with FIG. 2.
Figure 2:
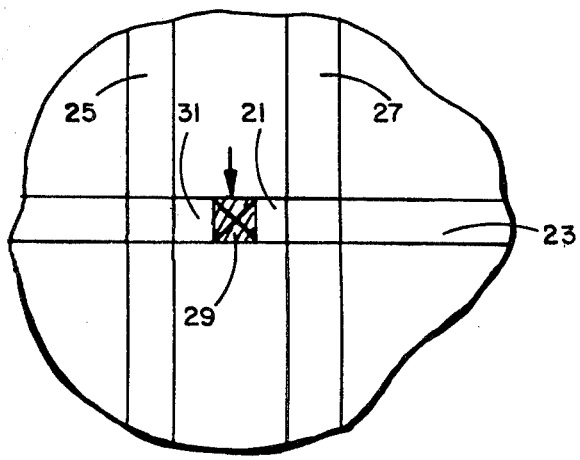
FIG. 2 shows the rearrangement of the FET cell in a ROM memory relative to diffusion bit lines and the metal word line with the poly gate and contact being in an aligned strip between bit lines.

Referring to FIG. 1, it may be seen that the FET is shown at 11 relative to diffusion bit lines 13 and 15 and metal word line 17. The gate contact is illustrated at 19, and the excessive use of real estate by this prior art device will best be seen from a consideration of FIG. 2 wherein the FET 21 is now in alignment with the metal word line 23 and extends between diffusion bit lines 25 and 27. As will be seen the contact to metal word line is shown at 29 and the drain region of the FET 21 is shown at 31 with the source region at 33. Thus, the minimum size of the ROM cell illustrated in FIG. 2 is achieved by eliminating the poly gate protrusion typical of the structure of FIG. 1. Thus, the gate overlap and contact areas of FIG. 2 show the savings resulting in the higher density ROM. In FIG. 1, the gate overlap is illustrated by $L_1$ and the gate overlap and contact area by $L_2$. Typical sizes of figures are 0.4 mil$^2$ using 4 $\mu$m technology while the same layout rules result in cell size of 0.15 mil$^2$ in FIG. 2. Naturally, higher speeds result from lower parasitic capacitance with the elimination of poly areas $L_1$ and $L_2$.

The ensuing description of FIGS. 3 through 7 will show how the ROM cell state (1 or 0) can be coded by drain-source ion implantation to complete the channel. This technique allows ROM circuits to be processed through the gate polysilicon, and be stored in inventory. Once the customer ROM pattern order is received, the wafers can then go through the drain-source implant, contact and metallization steps, therefore cutting down delivery times substantially.

In FIGS. 3A and 3B there is shown a p doped substrate 101 on which three different structures or configurations are simultaneously fabricated to illustrate the principles of the present invention.

The substrate 101 (e.g. silicon or silicon on sapphire), is cleaned, and then, subjected to thermal treatment to grow the oxide layer 109, 109' and 109".

First, using contact mask 1, shown at 107, conventional photoresist techniques are employed to open the contact areas through the oxide 109" for transistor 100 being fabricated at the right side of FIG. 3. In this manner, two contact areas 111 and 112 are exposed to the bare silicon or semiconductor substrate 101, by virtue of the mask 107 openings which render the photoresist soluble thereunder in active regions 113 and 115 such that proper solvents may dissolve or etch the same and expose the contact areas 111 and 112, leaving only the gate oxide of region 109" over the gate region to be formed.

The next step is to deposit a relatively thick layer of n+ doped polysilicon 119, 119' and 119" over the remaining layer of silicon dioxide 109, 109' and 109".

A layer of silicon nitride 121, 121' and 121" is deposited over the polysilicon layer 119, 119' and 119" in preparation for the use of mask 2, shown at 105, (and mask 103) for the n+ diffused lines.

In the left-hand portion of FIG. 3, there is shown a mask 103 for outlining the active portion of a semiconductor type device 98 which will be incomplete to represent the coding of digital 0, along with a pair of diffused lines. In the middle of FIG. 3 there is shown a corresponding mask 105, labelled MASK 2, identical to the active mask 103, for outlining a semiconductor device 99 which will code or be programmed as a 1, with diffused lines, and on the right-hand side of FIG. 3, there is shown mask 105' for developing the active portion of transistor 100, per se, of the FET type in accordance with the principles herein taught. These three structures are typical of the types principally used in a high density ROM integrated circuit.

In FIG. 3, the active FET region and the n+ diffused line regions are delineated or protected by the middle of the mask and the vertical portions of mask 2, shown at 131 and 133. Accordingly, conventional photoresist techniques are employed to render these areas insoluble, as a result of actinic radiation, about mask 2 such that the nitride layer 121 may be removed all around mask 2, as by plasma etching, followed by removal of the polysilicon corresponding areas of layer 119' by suitable solvent and similarly the underlying, now uncovered, portions of oxide layer 109'. It is not really necessary to remove the polysilicon. The same is true of structure 98 using mask 103. Thus, the field region is now exposed to the substrate 101. Since mask 103 conforms to mask 105, this same situation obtains with respect to the left-hand portion of FIG. 4 wherein the 0 coded device 98 is being created, and accordingly, the n+ diffused line regions 141 and 143 are simultaneously formed and the field region thereabout is exposed to the substrate.

Next the regions beneath the field regions are doped the same (p+) as the doping of substrate 101 to enhance the isolation of each active region. The x's 110 indicate this implanted doping material. Note that the silicon nitride layer 121, 121' and 121", where present, prevents the ions from being implanted in the active regions other than the field.

The next step in the process is to form the field oxide which surrounds each active device. However, for purposes of illustration each cross sectional region of field oxide will be identified by a different number such as the left-hand field oxide being 145, the next field oxide 147, the next one 149 and the right-hand portion 151. Thermal oxidation of the substrate 101, which grows both inwardly, and outwardly above its upper surface, is continued with the heavy regions 145, 147, 149 and 151 providing the required thickness of field oxide. Suitable dimensioning and further details of conventional etching solutions and the like as in process steps herein described may be obtained from U.S. Pat. No. 4,231,051 issued to the same inventors on Oct. 28, 1980, although adequate information is presented herein to teach those reasonablly skilled in the art to practice this information.

With reference to FIG. 4, first consider mask 3 for the "1" device 99 shown in the upper middle portion of the figure. This mask is to permit n+ line diffusions while precluding source and drain diffusions for the devices 98 and 99 and the mask is accordingly shown at 161 and 163 for devices 98 and 99, respectively to shield these regions from the actinic radiation and maintain photoresist insoluble therebeneath. Thus, in FIG. 4, the remaining silicon nitride regions 121 and 121' are protected which preserves intact the polysilicon layers 119 and 119' therebeneath and the silicon oxide layer 109 and 109' beneath the poly. However, suitable etching solutions remove the silicon nitride portions of layer 121 and 121' to the left and right of the preserved portions along with the poly therebeneath and the silicon dioxide therebeneath, to expose n+ line regions 141 and 143 for device 98 and 135 and 137 for device 99.

Next, these regions are suitably doped which may be achieved by ion implanting or by utilizing a doped material over the regions 141 and 143 and 135 and 137 and driving the dopant therefrom into the substrate 101. In the example given in FIG. 4, this doping is of the n+ type.

The silicon substrate 101 is again oxidized to grow the oxide layers 141', 143', 135' and 137' over the respective diffused lines therebeneath.

The last step with respect to FIG. 4 is the use of the mask 4 for each of the devices 98, 99 and 100. This is the gate contact mask which narrows the gate, per se to the width of the mask itself. Accordingly, following conventional techniques, exposure is made utilizing mask 4 for all three devices and protective photoresist regions 201, 202, 203, 204 and 205 remain after development. It will be noted in connection with transistor device 100, mask 4 retains the three regions 203, 204 and 205.

Note that mask 4 covers the gate regions of all three devices and also the contact regions of the transistor device 100. It is for this reason that it is called a gate-contact mask.

Figure 5A:
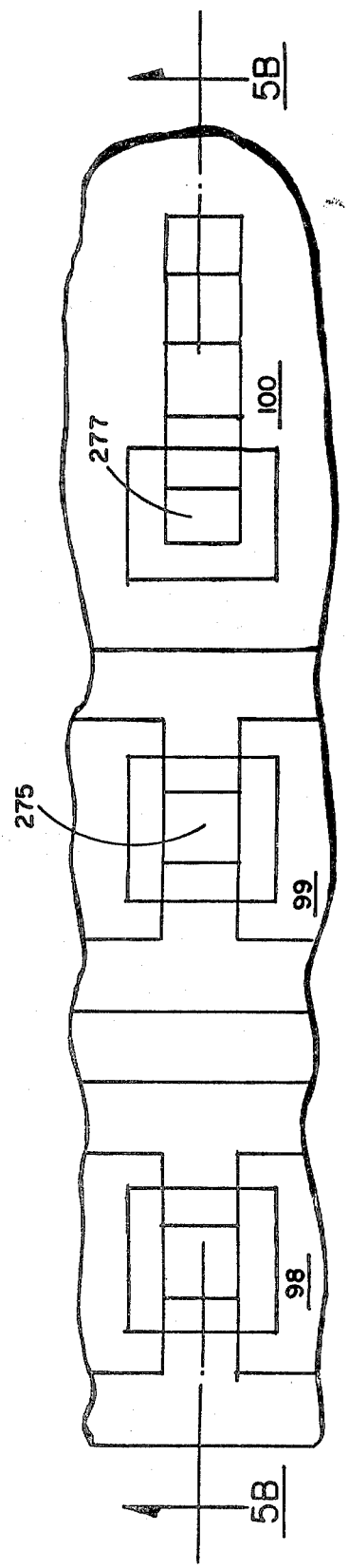
FIGS. 5A and 5B illustrate steps 16 through 21 in the continued fabrication and programming of the structures.
Figure 5B:
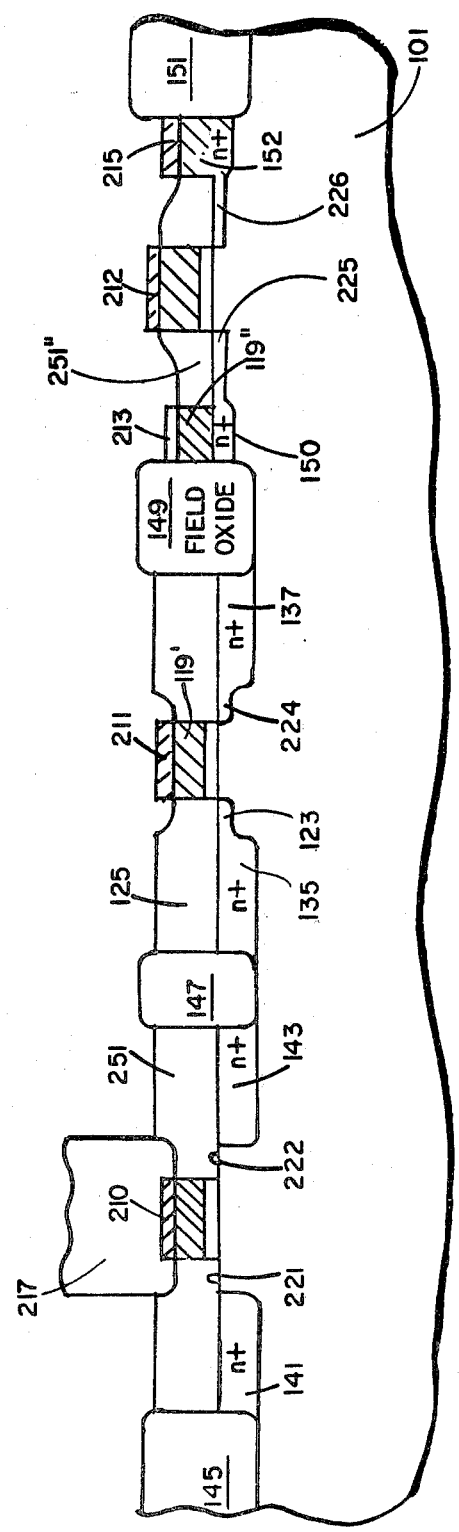

Reference now to FIG. 5 illustrates the process after etching has taken place at FIG. 4 to remove, first the uncovered nitride layers 121, 121', and thereafter the layers beneath (i.e.) exposes much of the silicon substrate upper surface except for the regions covered by the gate protective nitride buttons 210, 211 and 212, all covering the gate regions and also the nitride buttons 213 and 215 covering the contact regions for the transistor device 100.

The succeeding step in FIG. 5 is the use of mask 5 which is the ROM code program mask to lay down the photoresist shown as A at 217 for the device 98 which will be programmed with a 0.

The next step is implanting the source and drain regions, but as can be seen in device 98, photoresist A shown at 217 covers the source and drain regions 221 and 222 and therefore no implanting is made with respect to this particular device which causes it to encode 0 because its channel is incomplete.

On the other hand, neither of these regions is covered for devices 99 and 100 and accordingly the source and drains 223 and 224 are implanted for device 99 to encode 1, and also in transistor device 100 at 225 and 226 to develop the transistor structure. It will be seen that the source and drain regions of the two cell devices 98 and 99 respectively make contact with the diffused lines 141, 143 and 135, and 136 whereas gating transistor 100 has source and drain contacts 150 and 152.

After the coding step has been completed, the masking for resist material A, shown at 217 is removed and oxide is grown over the source and drain regions which have been implanted. This oxide is shown at 251, 251' and 251''.

Still referring to FIG. 5, the optional step is the use of the mask 6 shown on device 99 as a contact mask for the second polysilicon deposition. This step is unnecessary to the fabrication of a ROM, but is illustrative of one type interconnect if the substrate includes transistors, such as gating devices.

The purpose of mask 6 is to remove the nitride buttons 211 and 213 in order that a feature of versatility in the present invention may be shown by connecting the gate of device 99 to the source of device 100. Accordingly, mask 6 includes the opening 275 for rendering soluble the photoresist to be laid down on top of nitride button 211 in order that the photoresist may protect the rest of the circuitry while the nitride button 211 is etched away as by plasma etching. Similarly, the mask 6 for transistor 100 includes the opening 277 for eliminating nitride button 213 to expose the polysilicon 119'' therebetween as is polysilicon 119' exposed beneath the button 211 for device 99.

Figure 6A:
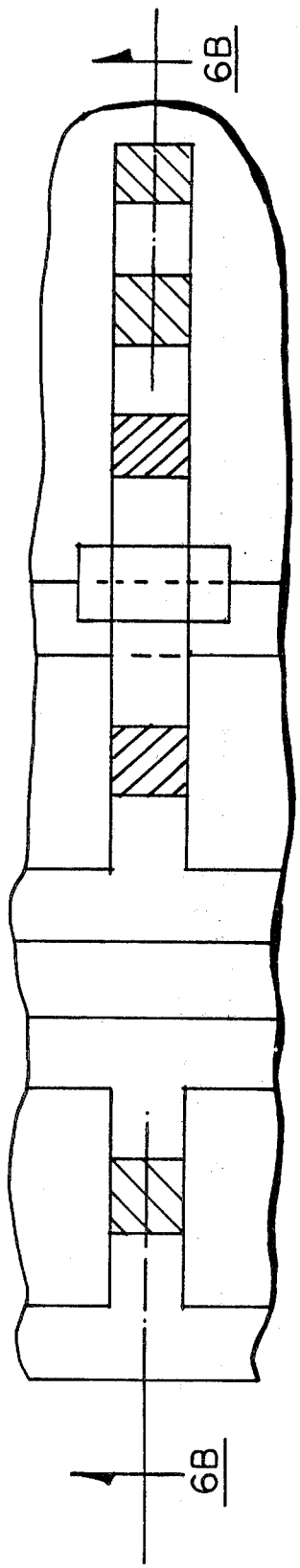
FIGS. 6A and 6B illustrate steps 22 through 27 showing the versatility of the subject fabrication method and structure providing air connects.
Figure 6B:
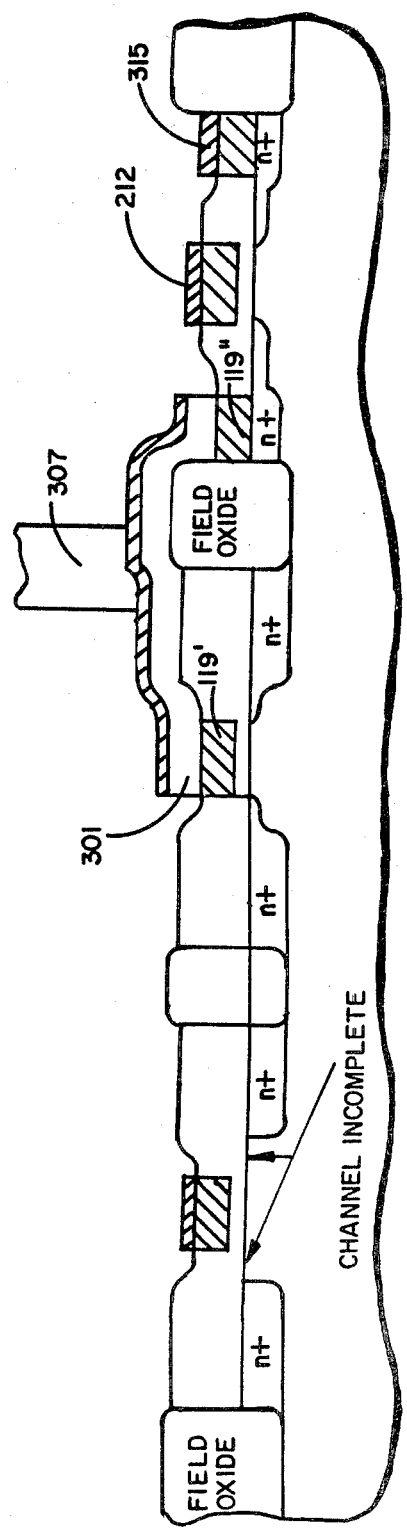

Reference now to FIG. 6 shows the first step as being the etching of the nitride buttons selectively as a result of the protective photoresist laid down by mask 6 such that the nitride buttons 211 and 213 are gone.

The next step is depositing a layer of polysilicon II, shown at 301, which generally follows the contour of the surface on which it is deposited. Mask 7 provides for the polysilicon interconnect, i.e. the removal of all polysilicon II except the region 301, shown in FIG. 6.

The next step is to deposit the nitride layer 303 over the polysilicon 301. It is actually at this point that mask 7 is utilized to remove the excess nitride layer 303 and poly II layer 301 to leave the configuration shown in FIG. 6, accomplished by etching away the unprotected nitride and polysilicon II.

Mask 8 is provided for a self-registered contact for polysilicon II layer 301; hence photoresist is laid down and retained underneath the covering mask 8, as shown at 307. The uncovered layer of silicon nitride 303 is next removed by etching, i.e. plasma etching without affecting the protected contact region.

Figure 7A:
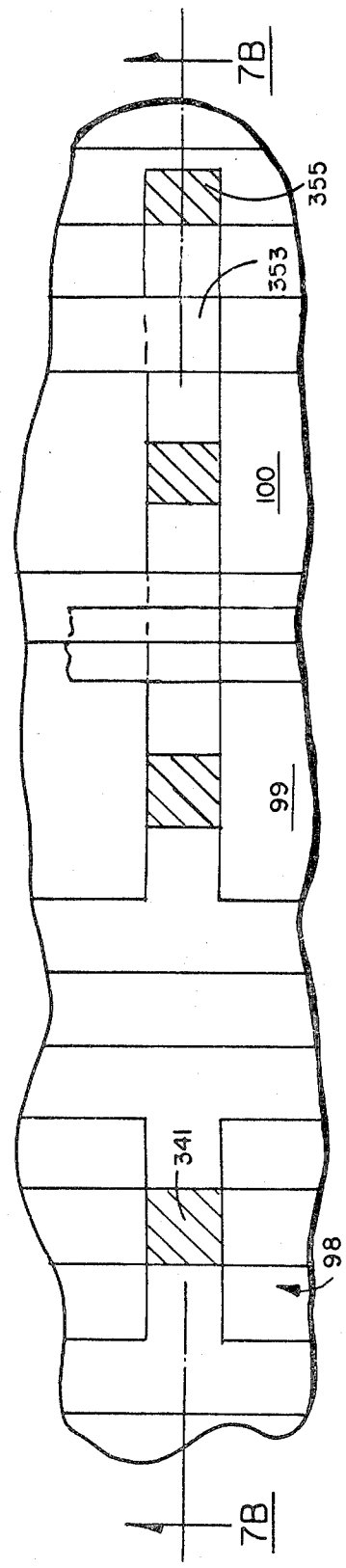
FIGS. 7A and 7B illustrate steps 28 through 34 and finalizing the ROM as well as a typical gating transistor and air connection therefor.
Figure 7B:
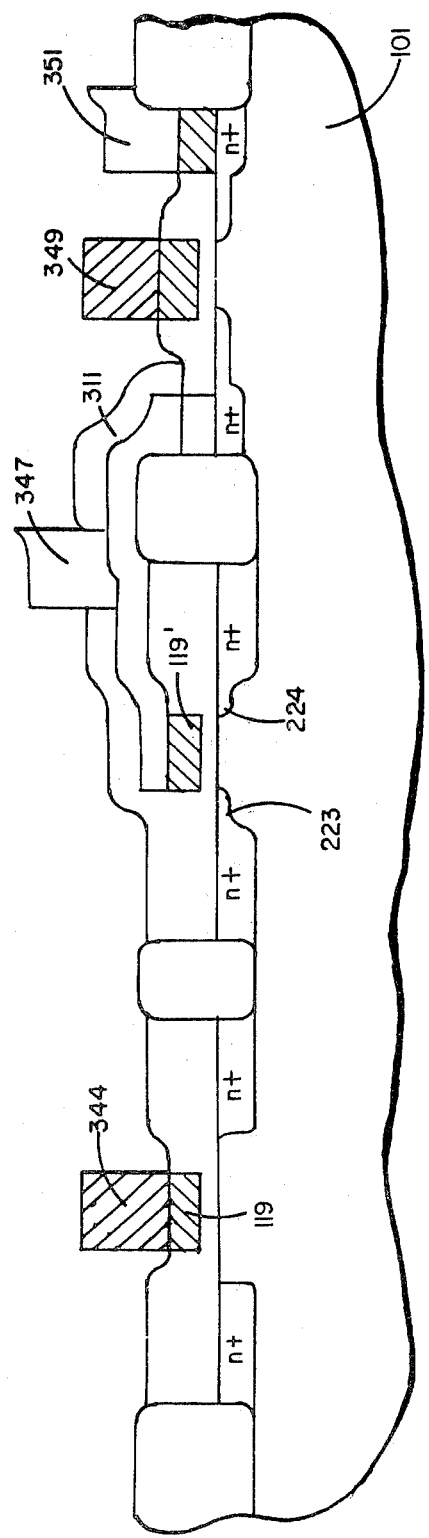

In FIG. 7, the nitride 303 is shown removed and the polysilicon II layer 301 is partially oxidized as indicated at 311.

The nitride button remaining under the photoresist 307 (FIG. 6) is removed by first removing the photoresist and then etching away the button thereberneath as shown in FIG. 7. At the same time, the nitride buttons 210, 212 and 215 (FIG. 6) are removed from the structure of FIG. 7 by the plasma etch which selectively removes the nitride but does not affect the silicon oxide or silicon oxide derived from the silicon layer II.

The next step is laying down of the metal pattern such as aluminum over the entire structure shown in FIG. 7.

Mask 9 is the metal pattern to delineate the contact regions for removal of the remaining metal. Thus, from the mask 9 for incomplete device 98, it may be seen that area 341 of mask 9 covers the region for aluminum 344 which makes contact with the poly 119 of the original layer which normally would be the gate except for the fact that the channel is incomplete in this device.

For the device 99, it may be seen that the metal connection 347 extends inwardly to polysilicon layer II which in turn connects to the gate original polysilicon layer 119' covering the region between source 223 and drain 224 for device 99. Similarly for the buttons 212, 215 which were removed from the gate and drain for transistor 100, metal contacts 349 and 351 are established by mask 9 due to the protective portions 353 and 355.

Thus, in summary, the versatility of the invention has been illustrated by processing an integrated chip or ROM memory chip through programming of devices for the 0 and 1 state. Also, a transistor has been produced which may comprise the gating transistor for a given cell or rows of cells.

While many of the steps may be replaced by other conventional steps such as N doping, it should be also apparent that the steps are not necessarily in a required sequence, but rather a preferred sequence, and certain steps may be achieved in slightly different order, and still result in developing of the specified products.

Accordingly, it is intended that the scope of this invention be determined by the scope of the attached claims, wherein what is claimed is:

1. A process for manufacturing high density VLSI circuits comprising control FETs, and ROM cells which are FETs for "1" logic state or incomplete FETs for "0" logic state to determine the ROM programming comprising the steps of:
    forming a gate oxide layer on p type substrate;
    using a drain, source, contact mask to open the drain source contact areas for the control FETs;
    depositing a first layer of n+ doped polysilicon over the gate oxide layer on the substrate;
    depositing silicon nitride over the polysilicon;
    using an active area mask to define active areas for the diffusion bit lines of the ROM cells, control FETs, and ROM FETs 1 and 0;
    removing the silicon nitride and polysilicon not defined by said mask which is the silicon nitride and polysilicon not covering the active areas and diffused lines;
    field implanting the areas exposed by said removal of the silicon nitride and polysilicon with p type dopant channel stops for improved isolation of the active areas;
    growing field oxide in the field implanted channel stop areas;
    using a diffusion bit line mask to remove silicon nitride and polysilicon from the diffusion bit lines for ROM cells 1 and 0;
    doping the diffusion bit lines with n+ dopant;
    growing cross-over oxide over the diffused bit lines;
    using a first polysilicon mask to remove silicon nitride and polysilicon except under the mask;
    using a ROM code program mask to cover all 0 ROM cells;

implanting drains and sources of the ROM cells 1 and of the control FETs with n+ dopant;

growing cross-over oxide over the implanted drain and source areas;

using a poly to poly contact mask to open such contacts in the cross-over oxide;

depositing a second layer of n+ doped polysilicon over the so-formed substrate which contacts the first polysilicon layer through said openings;

depositing silicon nitride over the second polysilicon;

using a second poly interconnect mask to define a second poly pattern;

etching the nitride and polysilicon where not protected by said last mentioned mask;

using a metal to poly contact mask to remove silicon nitride from the non-contact areas, thereby exposing underlying polysilicon;

oxidizing all polysilicon to form isolation oxide over the polysilicon;

removing silicon nitride from the contact areas;

depositing metal completely across the so-formed substrate;

using a metal mask to define the metal interconnect pattern; and sintering the so-formed wafer to provide said circuit with self-aligned devices.

* * * * *